United States Patent
Choi et al.

(10) Patent No.: US 9,686,878 B2
(45) Date of Patent: Jun. 20, 2017

(54) EXTERIOR COVER

(71) Applicant: Samsung Electronics Co., Ltd., Gyeonggi-do (KR)

(72) Inventors: Yeongsu Choi, Gyeonggi-do (KR); Taeseuk Kang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/057,059

(22) Filed: Feb. 29, 2016

(65) Prior Publication Data

US 2016/0255736 A1    Sep. 1, 2016

(30) Foreign Application Priority Data

Feb. 27, 2015 (KR) .......................... 10-2015-0028643

(51) Int. Cl.
*G06F 1/16* (2006.01)
*H05K 5/03* (2006.01)
*H04B 1/3888* (2015.01)
*H04M 1/18* (2006.01)
*A45C 13/02* (2006.01)
*H04M 1/02* (2006.01)
*A45C 11/00* (2006.01)

(52) U.S. Cl.
CPC ............... *H05K 5/03* (2013.01); *A45C 13/02* (2013.01); *G06F 1/1613* (2013.01); *H04B 1/3888* (2013.01); *H04M 1/185* (2013.01); *A45C 2011/002* (2013.01); *A45C 2011/003* (2013.01); *A45C 2013/025* (2013.01); *H04M 1/0214* (2013.01)

(58) Field of Classification Search
CPC .............................. G06F 1/1626; G06F 1/1656
See application file for complete search history.

(56) References Cited

U.S. PATENT DOCUMENTS

| 8,917,506 B2 * | 12/2014 | Diebel ................. G06F 1/1628 361/679.41 |
| 9,307,129 B2 * | 4/2016 | Oh ........................ H04N 5/2254 |
| 2007/0225031 A1 * | 9/2007 | Bodkin ................. A45C 3/001 455/550.1 |

(Continued)

FOREIGN PATENT DOCUMENTS

EP    2757759 A1    7/2014

OTHER PUBLICATIONS

European Patent Office, "European Search Report," Application No. EP16153581.0-1972, Dec. 2, 2016, 8 pages, publisher EPO, Munich, Germany.

*Primary Examiner* — Anthony Q Edwards

(57) ABSTRACT

An exterior cover of an electronic device includes a cradle cover to which the electronic device is fitted, a top cover that opens or closes a front face of the electronic device, and a connecting member interconnecting the top cover and the cradle cover. The top cover is configured to be conformally engaged with the cradle cover and to maintain the conformally engaged state. An exterior cover for an electronic device includes a cradle cover to which the electronic device is fitted, a top cover that opens or closes a front face of the electronic device, and a connecting member interconnecting the top cover and the cradle cover, wherein the top cover is configured to be conformally engaged with the cradle cover.

20 Claims, 17 Drawing Sheets

(56) References Cited

U.S. PATENT DOCUMENTS

| | | | |
|---|---|---|---|
| 2008/0096620 A1* | 4/2008 | Lee | G06F 1/1626 |
| | | | 455/575.8 |
| 2009/0072733 A1* | 3/2009 | Funayama | B82Y 20/00 |
| | | | 313/506 |
| 2014/0128131 A1* | 5/2014 | Sin | H04M 1/185 |
| | | | 455/575.8 |
| 2014/0274214 A1* | 9/2014 | Kim | H04M 1/0266 |
| | | | 455/566 |
| 2014/0318994 A1 | 10/2014 | Lee et al. | |
| 2014/0332417 A1* | 11/2014 | Wicks | H04B 1/3888 |
| | | | 206/37 |
| 2015/0045094 A1 | 2/2015 | Patterson et al. | |
| 2015/0105128 A1* | 4/2015 | Huang | H04B 1/3888 |
| | | | 455/575.8 |
| 2015/0153768 A1* | 6/2015 | Shih | G06F 1/1626 |
| | | | 345/173 |
| 2015/0276187 A1* | 10/2015 | Shoemake | F21V 21/00 |
| | | | 362/235 |
| 2016/0155375 A1* | 6/2016 | Park | G06F 1/1628 |
| | | | 345/173 |
| 2016/0234356 A1* | 8/2016 | Thomas | H04B 1/3888 |

\* cited by examiner

EXTERIOR COVER

CROSS-REFERENCE TO RELATED APPLICATION AND CLAIM OF PRIORITY

The present application is related to and claims benefit under 35 U.S.C. §119(a) to Korean Application Serial No. 10-2015-0028643, which was filed in the Korean Intellectual Property Office on Feb. 27, 2015, the entire content of which is hereby incorporated by reference.

TECHNICAL FIELD

The present disclosure relates to an exterior cover for a portable electronic device.

BACKGROUND

In general, a user of a portable electronic device, such as a smart phone or a tablet PC, mounts an exterior cover on the electronic device in order to protect the electronic device. The exterior cover is removably provided on the electronic device so as to protect the front face and/or the rear face of the electronic device. Since the electronic device is frequently carried by the user, the electronic device may be impacted, for example, by being dropped or may frequently get damaged on the external surface thereof by being scratched, which may be prevented by the exterior cover.

As other functions, the exterior cover is recognized as an accessory by being configured with various colors and designs, and may give a feeling of quality when its outer skin is formed of a leather of various colors. In particular, the electronic device, such as a smart phone or a tablet PC, has a display and/or a touch screen on the front face thereof. Thus, the front face may be protected by the exterior cover.

However, with a conventional exterior cover, only a portion of the display surface is transmitted through the exterior cover or the transmissivity is low so that the usability of the exterior cover is low. Further, since it is impossible to recognize and shield a hall IC, a lot of electricity is used and the possibility of a malfunction is high.

In addition, upon being wholly injection-molded (using PC and urethane), the conventional exterior cover is poor in flexibility and is easily damaged.

In addition, the exterior cover disables recognition between electronic devices and thus lacks a diversity of functions. Further, a receiver opening and a home key seating structure are not applied to the exterior cover, which reduces usability and increases the possibility of a malfunction.

Various embodiments of the present disclosure are to provide an exterior cover of an electronic device that functions as an accessory of the electronic device by enhancing the aesthetic function of the exterior cover.

Various embodiments of the present disclosure are to provide an exterior cover of an electronic device that enables genuine product certification so that an imitation of the exterior cover can be prevented and the exterior cover can be highly interlocked with the electronic device.

SUMMARY

To address the above-discussed deficiencies, it is a primary object to provide an exterior cover of an electronic device. The exterior cover may include a first cover made of a translucent resin material; a second cover, and a connecting member that interconnects the first and second covers.

Various embodiments of the present disclosure provide an exterior cover of an electronic device. The exterior cover includes a cradle cover to which the electronic device is fitted, a top cover that opens/closes a front face of the electronic device, and a connecting member that interconnects the top cover and the cradle cover. Various embodiments of the present disclosure provide an exterior cover of an electronic device. The exterior cover includes a first cover made of a translucent resin material, a second cover, and a connecting member that interconnects the first and second covers.

Various embodiments of the present disclosure provide an exterior cover of an electronic device. The exterior cover includes a cradle cover to which the electronic device is fitted, a top cover that opens or closes a front face of the electronic device, and a connecting member interconnecting the top cover and the cradle cover. The top cover is configured to be conformally engaged with the cradle cover and to maintain the conformally engaged statemally engaged with the cradle cover and to maintain the conformally engaged state.

Before undertaking the DETAILED DESCRIPTION below, it may be advantageous to set forth definitions of certain words and phrases used throughout this patent document: the teens "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
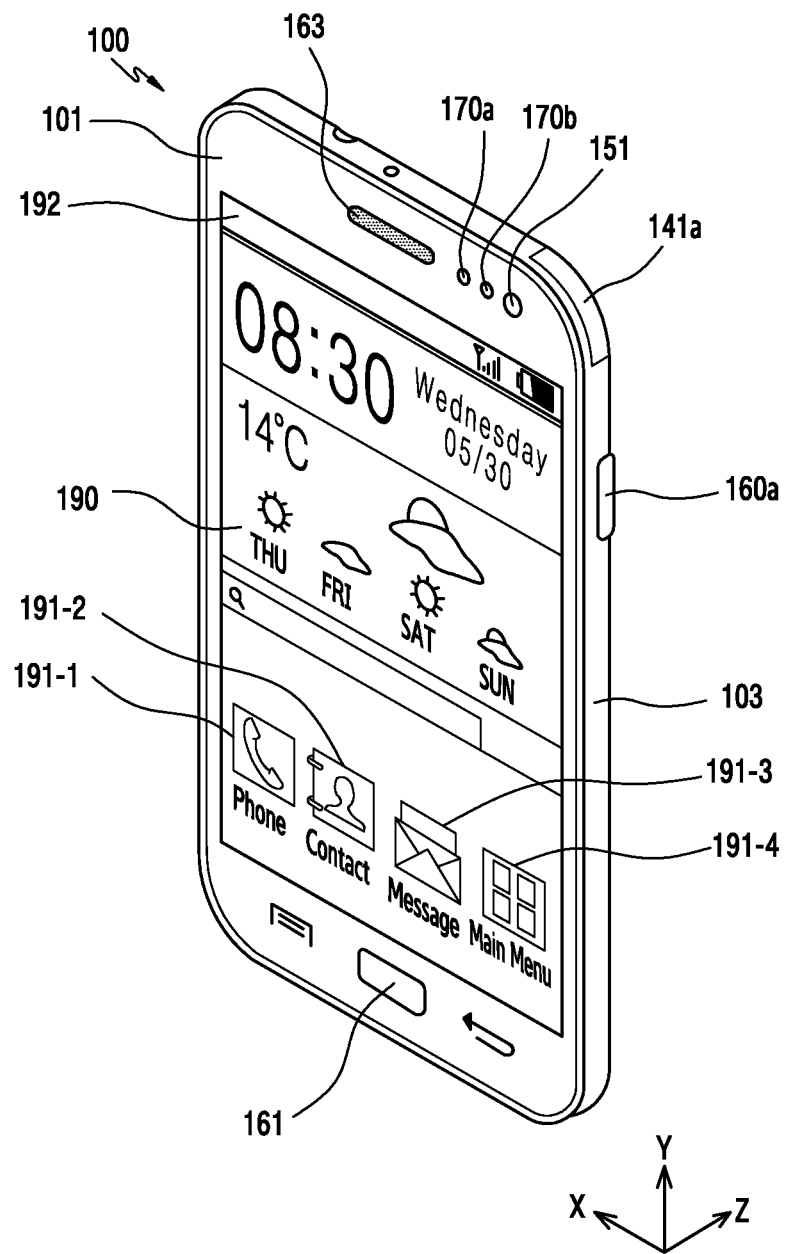
FIG. 1 is a perspective view illustrating a front side of an electronic device according to various embodiments of the present disclosure.

FIGS. 1 through 16, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged housing devices. Hereinafter, various exemplary embodiments of the present disclosure will be explained with reference to the accompanying drawings. Although specific embodiments of the present disclosure are illustrated in the drawings and relevant detailed descriptions are provided, various changes can be made and various exemplary embodiments may be provided. Accordingly, various exemplary embodiments of the present disclosure are not limited to the specific embodiments and should be construed as including all changes and/or equivalents or substitutes included in the ideas and technological scopes of exemplary embodiments of the present disclosure. In the explanation of the drawings, similar reference numerals are used for similar elements.

The terms "include" or "may include" used in the exemplary embodiments of the present disclosure indicate the presence of disclosed corresponding functions, operations, elements, and the like, and do not limit additional one or more functions, operations, elements, and the like. In addition, it should be understood that the terms "include" or "have" used in the exemplary embodiments of the present disclosure are to indicate the presence of features, numbers, steps, operations, elements, parts, or a combination thereof described in the specifications, and do not preclude the presence or addition of one or more other features, numbers, steps, operations, elements, parts, or a combination thereof.

The term "or" used in the exemplary embodiments of the present disclosure include any and all combinations of words enumerated with it For example, "A or B" means including A, including B, or including both A and B.

Although the terms such as "first" and "second" used in the various exemplary embodiments of the present disclosure may modify various elements of the various exemplary embodiments, these terms do not limit the corresponding elements. For example, these terms do not limit an order and/or importance of the corresponding elements. These terms may be used for the purpose of distinguishing one element from another element. For example, a first electronic device and a second electronic device all indicate electronic devices and may indicate different electronic devices. For example, a first element may be named a second element without departing from the scope of right of the various exemplary embodiments of the present disclosure, and similarly, a second element may be named a first element.

It will be understood that, when an element is mentioned as being "connected" or "coupled" to another element, the element may be directly connected or coupled to another element, and there may be an intervening element between the element and another element. To the contrary, it will be understood that, when an element is mentioned as being "directly connected" or "directly coupled" to another element, there is no intervening element between the element and another element.

The terms used in the various exemplary embodiments of the present disclosure are for the purpose of describing specific exemplary embodiments only and are not intended to limit various exemplary embodiments of the present disclosure. As used herein, the singular forms are intended to include the plural forms as well, unless the context clearly indicates otherwise. All of the terms used herein including technical or scientific terms have the same meanings as those generally understood by an ordinary skilled person in the related art unless they are defined otherwise. The terms defined in a generally used dictionary should be interpreted as having the same meanings as the contextual meanings of the relevant technology and should not be interpreted as having ideal or exaggerated meanings unless they are clearly defined in the various exemplary embodiments.

An electronic device according to various exemplary embodiments of the present disclosure may be a device that is equipped with a communication function. For example, the electronic device may include at least one of a smartphone, a tablet personal computer (PC), a mobile phone, a video phone, an electronic book reader, a desktop PC, a laptop PC, a netbook computer, a Personal Digital Assistant (PDA), a Portable Multimedia Player (PMP), an MP3 player, a mobile medical machine, a camera, or a wearable device (for example, a head-mounted-device (HMD) such as electronic glasses, electronic clothing, an electronic bracelet, an electronic necklace, an electronic appcessory, electronic tattoos, or a smart watch).

The electronic device according to various exemplary embodiments of the present disclosure may be one or a combination of one or more of the above-mentioned devices. In addition, the electronic device according to various exemplary embodiments of the present disclosure may be a flexible device. In addition, it is obvious to an ordinary skilled person in the related art that the electronic device according to various exemplary embodiments of the present disclosure is not limited to the above-mentioned devices.

Hereinafter, an electronic device according to various exemplary embodiments will be explained with reference to the accompanying drawings. The term "user" used in the various exemplary embodiments may refer to a person who uses the electronic device or a device that uses the electronic device (for example, an artificial intelligence electronic device).

Figure 2:
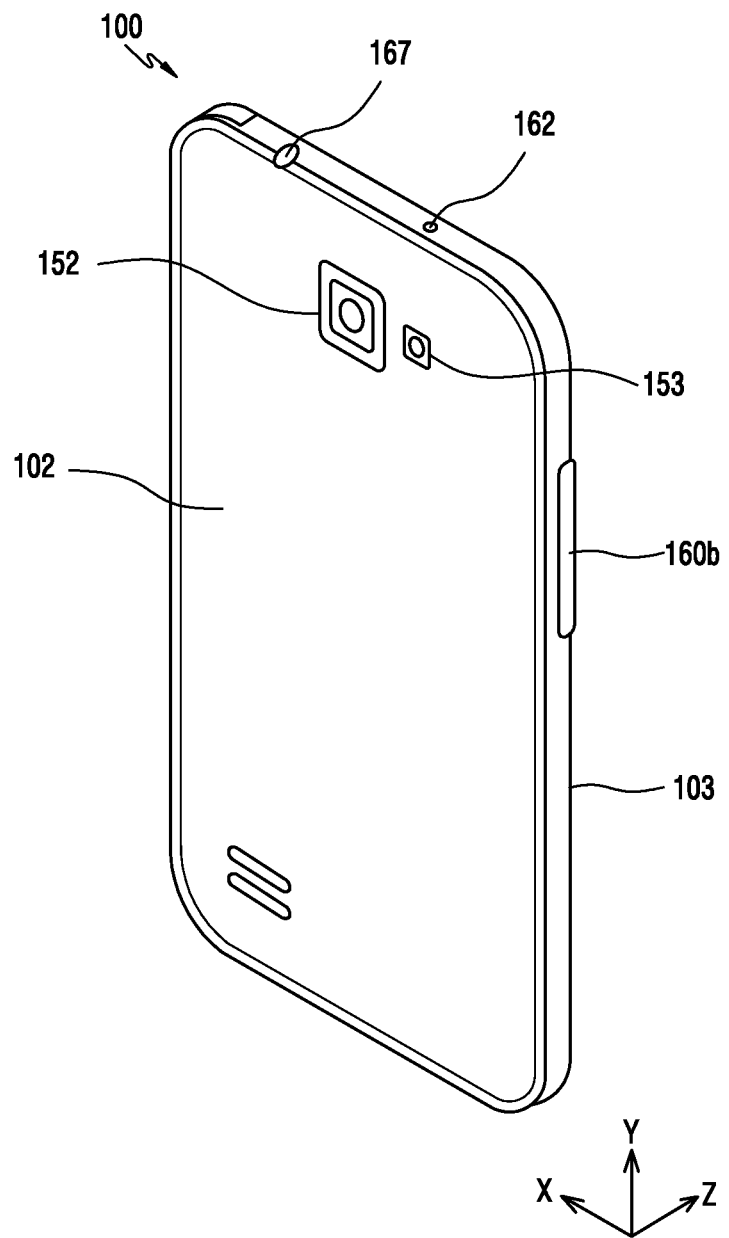
FIG. 2 is a perspective view illustrating a rear side of the electronic device according to various embodiments of the present disclosure.

FIG. 1 is a perspective view illustrating a front side of an electronic device according to various embodiments of the present disclosure. FIG. 2 is a perspective view illustrating a rear side of the electronic device according to various embodiments of the present disclosure.

Referring to FIGS. 1 and 2, according to various embodiments, an electronic device 100 includes a touch screen 190 that is centrally arranged on the front face 101 thereof. The touch screen 190 is formed in a large size to occupy a large portion of the front face 101 of the electronic device 100. FIG. 1 illustrates an example in which a main home screen is displayed on the touch screen 190. The main home screen refers to the first screen that is displayed on the touch screen 190 when the power of the electronic device 100 is turned on. According to various embodiments, when the electronic device 100 has several pages of different home screens, the main home screen can be the first home screen among the several pages of different home screens. The home screen can display shortcut icons 191-1, 191-2, and 191-3 to execute frequently used applications, a main menu switching key 191-4, time, weather, or the like. The main menu switching key 191-4 can cause the main screen to be displayed on the touch screen 190. In addition, in the upper end of the touch screen 190, status bars 192 can be formed to indicate the statuses of the electronic device 100, such as a battery charge status, a received signal strength, and current time. Below the touch screen 190, a home button 161, a menu button, and a back button can be formed.

According to various embodiments, the home button 161 causes the main home screen to be displayed on the touch screen 190. For example, when the home button 161 is touched in the state where a home screen, which is different from the main home screen, or the menu screen is displayed on the touch screen 190, the main home screen can be displayed on the touch screen 190. In addition, when the home button 161 is touched while applications are executed on the touch screen 190, the main home screen illustrated in FIG. 1 can be displayed on the touch screen 190. In addition, the home button 161 can be used in order to cause the touch screen 190 to display the most recently used application or a task manager.

According to various embodiments, the menu button provides a connection menu that can be used on the touch screen 190. The connection menu can include a widget addition menu, a background screen change menu, a retrieve menu, an edition menu, an environment setting menu, or the like. The back button can cause the screen, which was executed just prior to the currently executed screen, to be displayed, or can cause the most recently used application to be terminated.

According to various embodiments, a first camera 151, an illuminance sensor 170a, a proximity sensor 170b, and a receiver 163 can be arranged in an edge of the front face 101 of the electronic device 100. According to various embodiments, a second camera 152, and a flash 153 can be arranged on the rear face 102 of the electronic device 100.

According to various embodiments, for example, a power/reset button 160a, a volume button 160b, a terrestrial DMB antenna 141a for broadcasting reception, one or more mics 162, or the like can be arranged on the side face 100b of the electronic device 100. For example, the DMB antenna 141a can be fixed to the electronic device 100, or can be formed to be removable from the electronic device 100.

According to various embodiments, a connector is formed on the lower end side face of the electronic device 100. The connector is formed with a plurality of electrodes, and can be connected to an external device via a wire. An earphone connecting jack 167 can be arranged on the upper end side face of the electronic device 100. An earphone can be inserted into the earphone connecting jack 167. The earphone connecting jack 167 can be arranged on the lower end side face of the electronic device 100.

Figure 3:
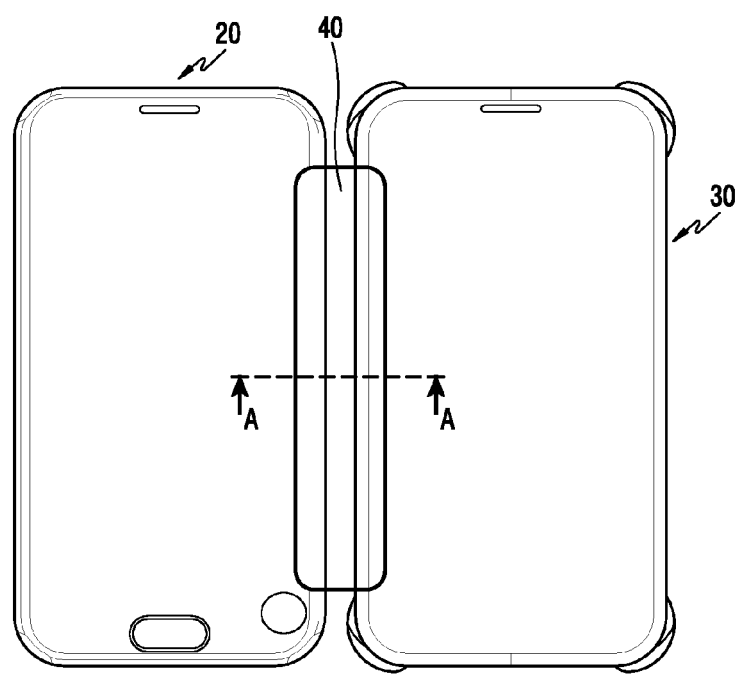
FIG. 3 is a view illustrating an exterior cover according to various embodiments of the present disclosure.

FIG. 3 is a view illustrating an exterior cover according to various embodiments of the present disclosure.

Referring to FIG. 3, according to various embodiments of the present disclosure, an exterior cover refers to a cover, to which the electronic device 100 (see FIGS. 1 and 2) is fitted, to be carried together with the electronic device. In particular, the exterior cover refers to an exterior cover that can protect the exterior of the electronic device fitted thereto can be formed of a high quality material with various colors, and can have a cradler function by itself. According to various embodiments, the electronic device refers to a portable electronic device among general electronic products. In particular, the electronic device can refer to a miniaturized/slimmed mobile communication device. According to various embodiments, the electronic device can be any one of a mobile phone, a palm-sized Personal Computer (PC), a Personal Communication System (PCS), a Personal Digital Assistant (PDA), a Hand-held PC (HPC), a smart phone, a Local Area Network (LAN) terminal, a laptop computer, a netbook PC, a notebook PC, and a tablet PC.

According to various embodiments of the present disclosure, the electronic device can be a "tablet PC" or a "smart phone". Hereinafter, descriptions will be made on a configuration of an exterior cover according to an embodiment of the present disclosure assuming that the electronic device is a smart phone. Being positioned on the exterior of the electronic device, the exterior cover can be referred to as a protective cover, an accessory cover, an external appearance cover, or the like.

According to various embodiments, the electronic device includes a display 190 that is arranged on the front face thereof to enable a touch input, and is protected by the exterior cover. The display 190, which is arranged on the electronic device 100, can receive a contact input, a movement input, or a gesture input of a touch input means, such as a finger or a stylus pen.

According to various embodiments of the present disclosure, the exterior cover can include a first cover 20, a second cover 30, and a connecting member 40 that interconnects the first and second covers 20 and 30. Being positioned on the front face of the electronic device, the first cover 20 can be referred to as a "top cover," and, being positioned on the rear face of the electronic device, the second cover 30 can be referred to as a cradle cover. In addition, upon being folded, the first and second covers 20 and 30 can correspond to a region that encloses the rear face of the electronic device and a region that enclose the first face of the electronic device, respectively. In addition, the first and second covers 20 and 30 can be separated from each other, and can be interconnected using a connecting member 40 therebetween.

According to various embodiments, the lower cover 30 can be the rear face of the electronic device itself, or can be formed as a structure that is removable from the rear case. The upper cover 20 can be folded to/unfolded from the front face of the electronic device. The sizes of the lower cover 30 and the upper cover 20 can be configured to cover the rear face and the front face of the electronic device, respectively.

Descriptions will be made on a configuration of a cover according to various embodiments with reference to FIGS. 4 to 8.

Figure 4:
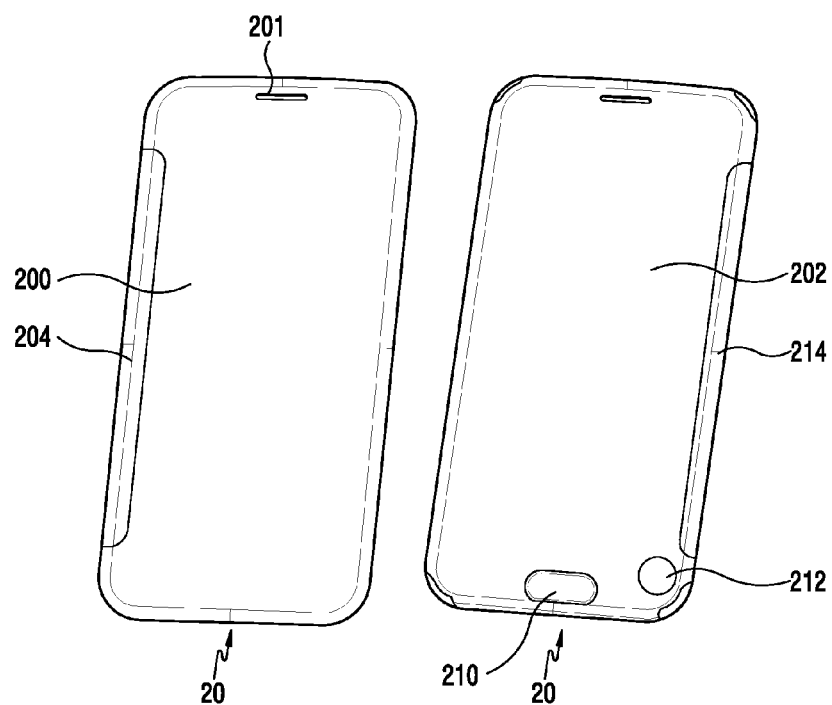
FIG. 4 illustrates inner and outer surfaces of a first cover according to various embodiments of the present disclosure.
Figure 5A:
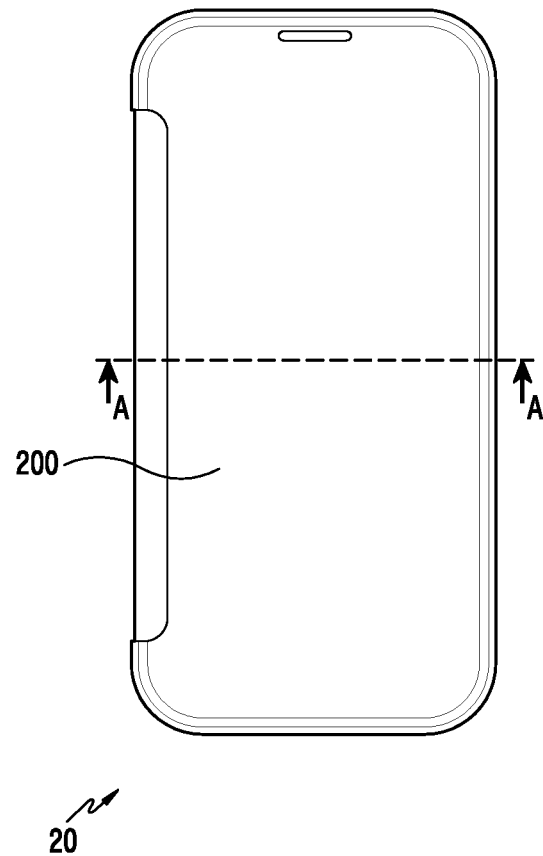
FIG. 5A is a view illustrating the inner surface of the first cover according to various embodiments of the present disclosure.

FIG. 4 illustrates inner and outer surfaces 200 and 202 of a first cover according to various embodiments of the present disclosure. FIG. 5A is a view illustrating the inner surface of the first cover according to various embodiments of the present disclosure, and FIG. 5B is a view illustrating a cross-section taken along line A-A in FIG. 5A.

Figure 5B:
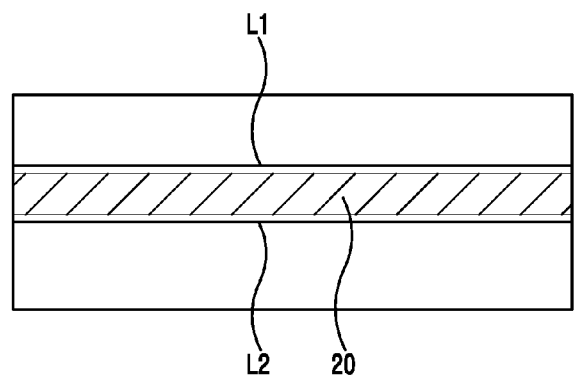
FIG. 5B is a view illustrating a cross-section taken along line A-A in FIG. 5A.

Referring to FIG. 4 and FIGS. 5A and 5B, according to various embodiments, the first cover 20 can be a cover that opens/closes the entirety or a portion of the front face of the electronic device. The first cover 20 can include a first surface 200, and a second surface 202 in the opposite direction to the first surface 200. The first surface 200 refers to a surface exposed to the outside and can be referred to as an "outer surface," and the second surface 202 refers to a surface that can face the front face of the electronic device and can be referred to as an "inner surface."

According to various embodiments, the first cover 20 can be made of a translucent synthetic resin material that is colored and has an improved transmissivity. When the first cover 20 is made of the translucent synthetic resin material, the electronic device can be easily confirmed in the state where the cover is closed on the electronic device so that the electronic device can be conveniently operated and the screen of the display can be easily observed. A deposited layer L1, which provides a mirror effect, can be further formed on the entirety or a part of the first surface 200 of the first cover 20. The deposited layer L1 can be configured through tin and multi deposition. In the state where the display is turned on, it is possible to display information that is transmitted through the cover in the state where the cover is not opened, and in the state where the display is turned off, a display feature, such as a peripheral region of the inner surface outside the display, is not seen. With this configuration, the user can use the first surface 200 as a mirror.

According to various embodiments, the first surface 200 can implement the mirror effect and a color feeling by the deposited layer L1, and a practical color can be provided by the color of the first cover that is made of a translucent material. According to various embodiments, the entirety or a part of the inner surface 202 of the first cover 200 can further be formed with an anti-scratch and anti-pollution layer L2. The layer L2 can refer to an etched surface that is added to a molded product mainly by etching. The layer L2 is formed since the inner surface 200 can come in contact with the surface of the display that is arranged on the electronic device.

According to various embodiments, the first cover 20 can include recesses 204 and 214 that are provided on the first surface 200 and the second surface 202, respectively, such that the connecting member 40 to be described later can be received and engaged in the recesses 204 and 214.

Figures 6A, 6B:
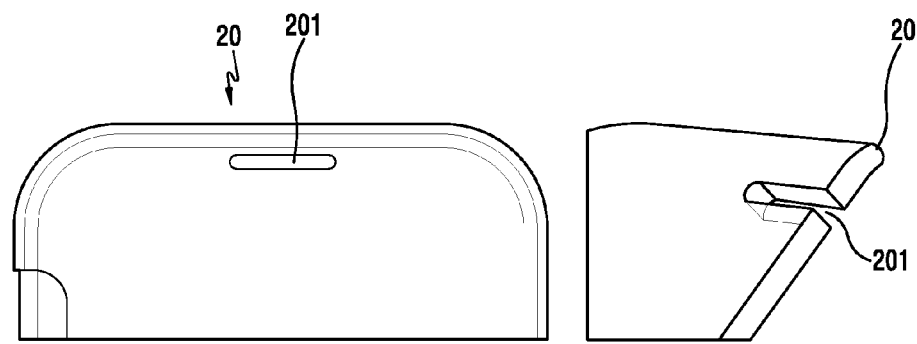
FIGS. 6A and 6B are views illustrating a receiver opening according to various embodiments of the present disclosure.

FIGS. 6A and 6B are views illustrating a receiver opening according to various embodiments of the present disclosure.

Referring to FIGS. 6A and 6B, according to various embodiments, the first cover 20 can have a receiver opening 201 on the upper end region thereof to communicate with the receiver that is arranged on the upper end of the front face of the electronic device. By the receiver opening 201, it is possible to prevent quality degradation and volume loss of the sound that emanates from the receiver even if the first cover 20 is closed to the front face of the electronic device (folded state).

Figures 7A, 7B:
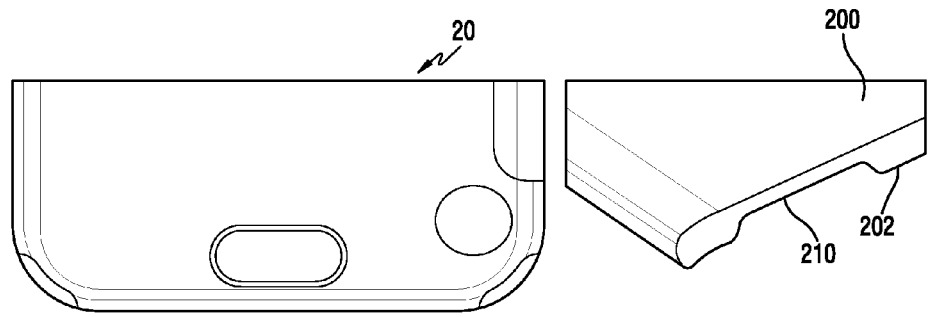
FIGS. 7A and 7B are views illustrating a home key recess according to various embodiments of the present disclosure.

FIGS. 7A and 7B are views illustrating a home key recess according to various embodiments of the present disclosure.

Referring to FIGS. 7A and 7B, according to various embodiments, the first cover 20 can further include a home key recess 210 that is formed in the lower end region of the inner surface 202. The home key is arranged on the front face of the electronic device near the lower end. The home key can be arranged in a shape that slightly protrudes from the front face. Accordingly, In the state where the first cover 20 is closed to the front face of the electronic device, the home key can be pushed by the inner surface, which can cause a malfunction. When the home key is excessively pushed, the electronic device can be damaged or can go wrong. In order to prevent this, the recess 210 can be configured in a shape that corresponds to the home key. Then, the recess 210 can receive a portion of the home key.

Figure 8:
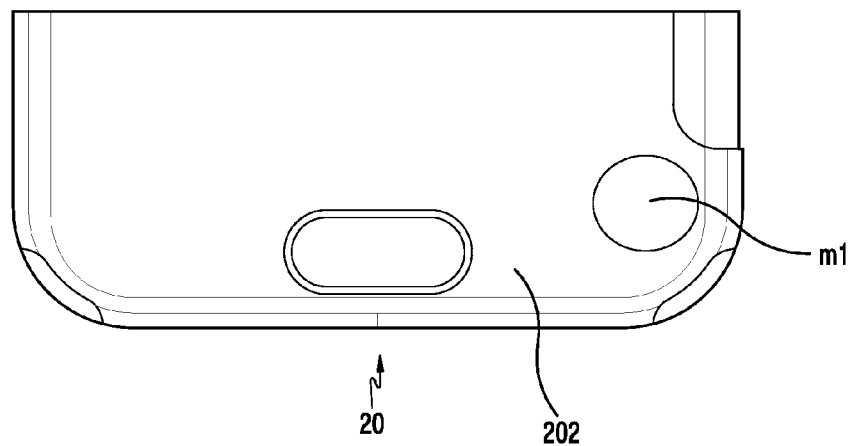
FIG. 8 is a view illustrating a state in which a magnetic material is provided on the first cover according to various embodiments of the present disclosure.

FIG. 8 is a view illustrating a state in which a magnetic material is provided on the first cover according to various embodiments of the present disclosure.

Referring to FIG. 8, according to various embodiments, the first cover 20 can include a first magnetic material m1 that is arranged at a predetermined position. The first magnetic material m1 can be, for example, a permanent magnet having a polarity. The first magnetic material m1 can interact with a magnetic force sensing unit that is provided in the electronic device so that the opening/closing of the cover can be sensed and unnecessary power consumption can be minimized.

According to various embodiments, a shield sheet can be attached on the region where the first magnetic material m1 is provided on the first cover in order to improve exteriority quality. The shield sheet can be applied with the same color as the first cover 20.

Figure 9:
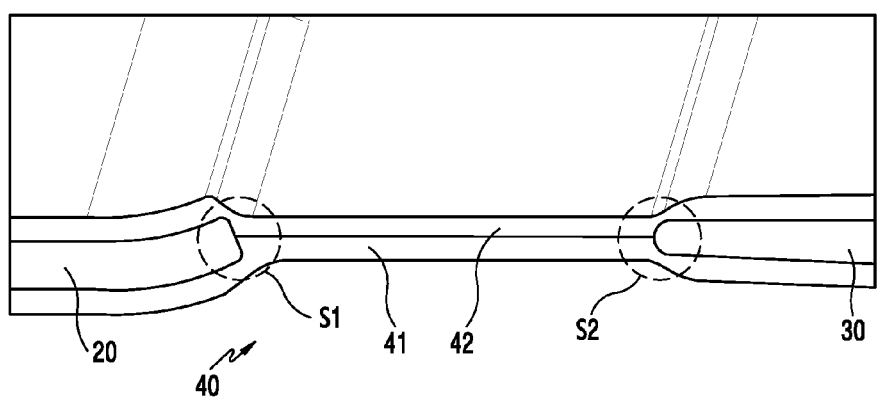
FIG. 9 is a view illustrating a connecting member according to various embodiments of the present disclosure in a coupled state.

FIG. 9 is a view illustrating a connecting member according to various embodiments of the present disclosure in a coupled state.

Descriptions will be made on a coupling structure of a connecting member 40 that interconnects the first and second covers 20 and 30 according to various embodiments with reference to FIG. 9.

Referring to FIG. 9, according to various embodiments, the connecting member 40 can include an inner skin 41 and an outer skin 42. The inner skin or the outer skin can include, for example, a synthetic resin or leather. The inner skin 41 and the outer skin 42 can be bonded to each other using hot-melt. The coupling structure of the connecting member 40 can include stepped structures S1 and S2. This is to prevent the outer skin 42 or the inner skin 41 from being pushed when the connecting member 40 is folded or unfolded.

Hereinafter, descriptions will be made on a configuration of the second cover with reference to the accompanying drawings.

Figure 10:
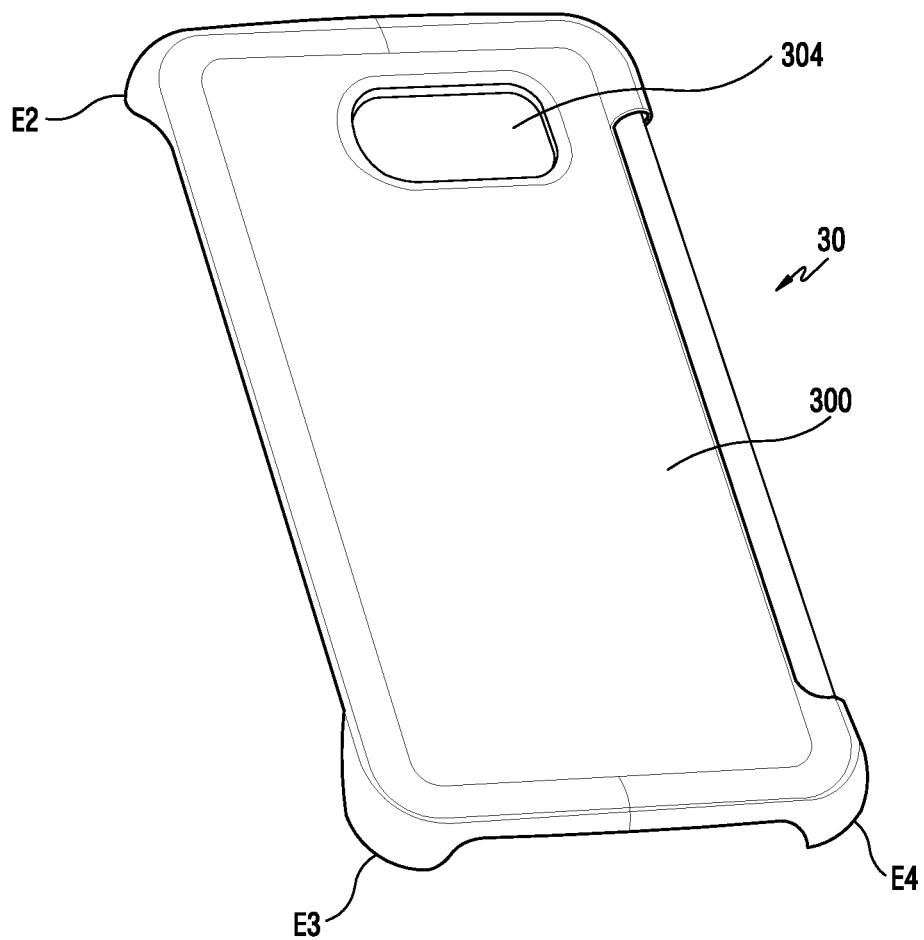
FIG. 10 is a view illustrating the second cover according to various embodiments of the present disclosure.
Figures 11A, 11B:
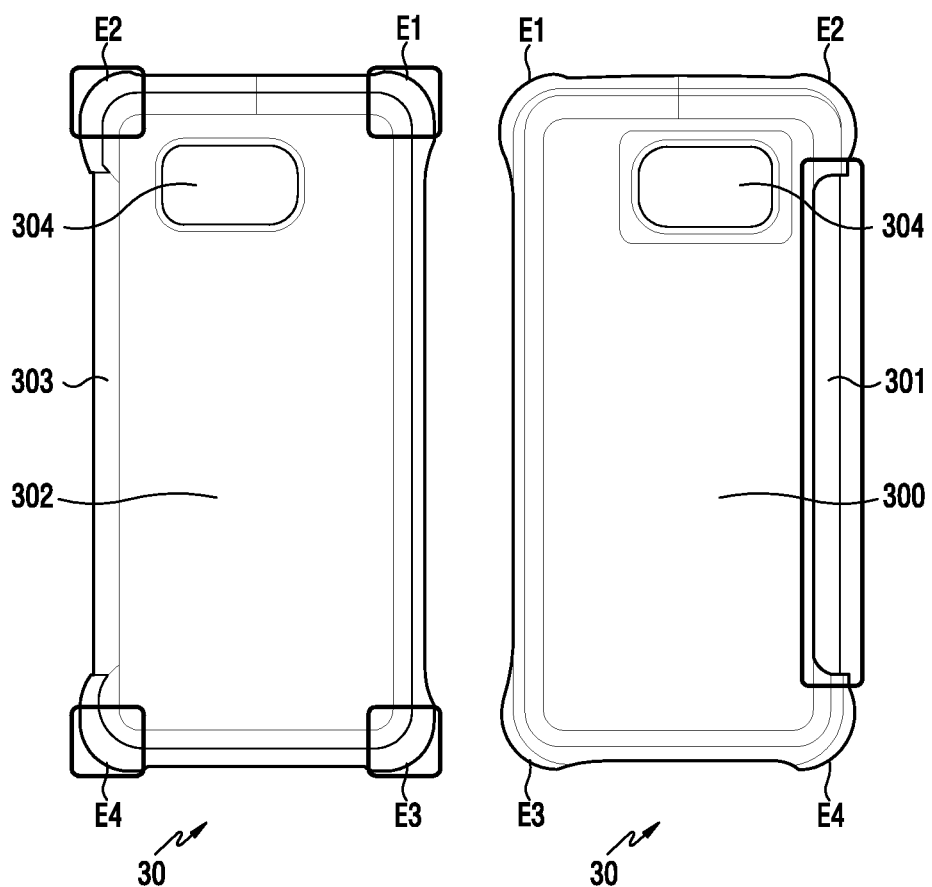
FIGS. 11A and 11B are views illustrating the inner surface and the outer surface of the second cover according to various embodiments of the present disclosure.
Figure 12:
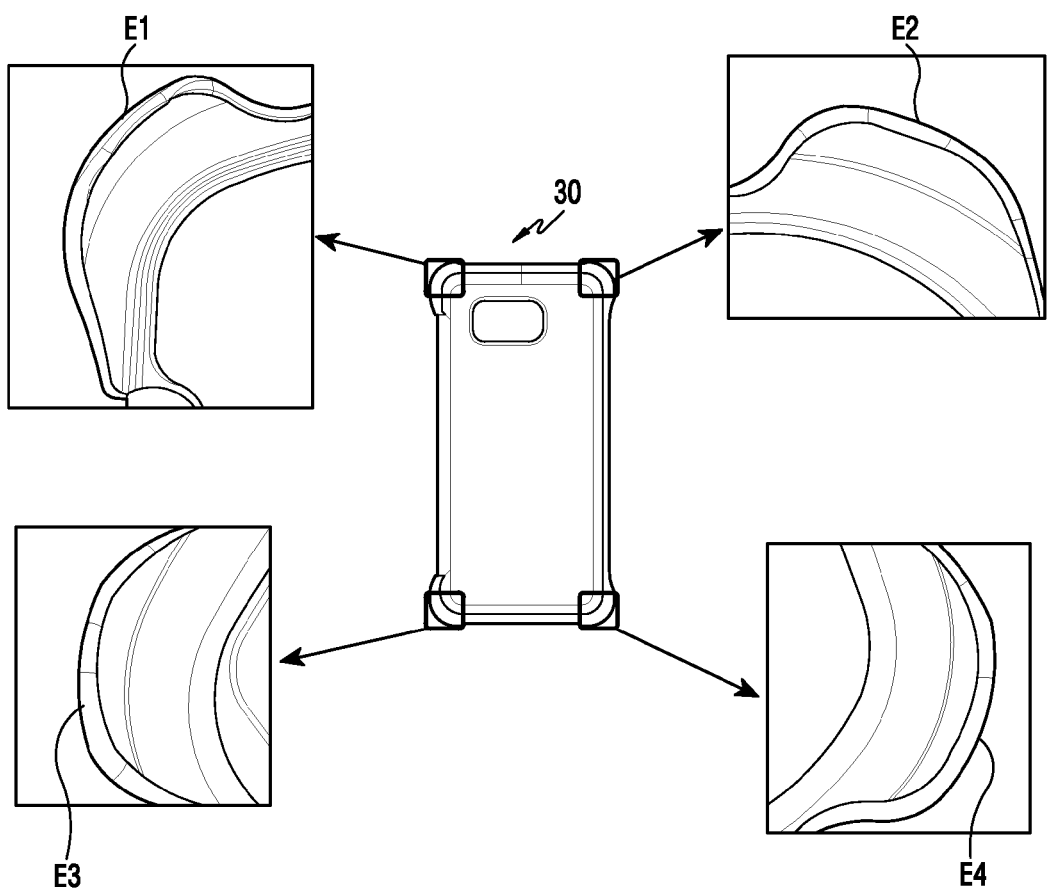
FIG. 12 illustrates first to fourth seat structures of the second cover according to various embodiments of the present disclosure.

FIG. 10 is a view illustrating the second cover according to various embodiments of the present disclosure. FIGS. 11A and 11B are views illustrating the inner surface and the outer surface of the second cover according to various embodiments of the present disclosure. FIG. 12 illustrates first to fourth seat structures of the second cover according to various embodiments of the present disclosure.

Referring to FIGS. 10 to 12, according to various embodiments, the second cover can be a cradle cover to which the electronic device is fitted. The second cover can protect the electronic device fitted thereto together with the first cover. The second cover can be provided with first to fourth seat structures at four corner regions thereof. The seat structures can be the portions that are conformally engaged with four corner portions of the first cover, respectively.

According to various embodiments, the second cover can include a base and four seat structures that are integrally injection-molded at four corners of the base, respectively. Each of the first to fourth seat structures can protrude in a shape standing in a substantially vertical direction from the base. In particular, the first to fourth seat structures can be shaped to enclose the corner regions of each of the electronic device and the second cover, respectively. Each of the first to fourth seat structures is elastically deformed to be slightly biased outwardly, and can be fitted on or separated from one of the corner portions of the first cover.

According to various embodiments, the second cover can include a camera opening or a flash opening. In addition, the second cover can be provided with recesses to which the connecting member is seated and joined through a hot-melt process.

Referring to FIG. 12, each of the first to fourth seat structures can further include a stepped shape at the end, which corresponds to the shape of each corner of the first cover. The shape include a linear portion so that when the seat structures are engaged with the corner portions of the first cover, the first cover is caught not to be moved, thereby preventing the display from being damaged (e.g., scratched) by being moved vertically or horizontally.

Figure 13:
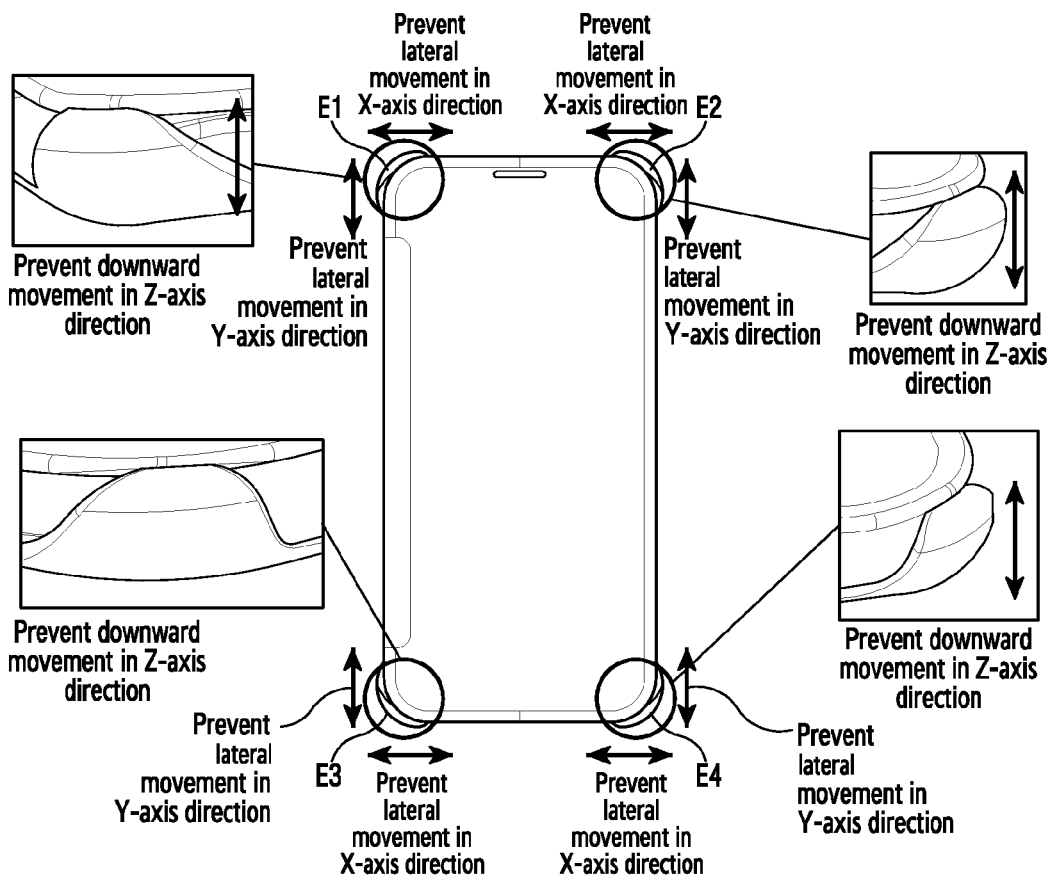
FIG. 13 is a view illustrating a state in which the first cover is conformally engaged with the second cover according to various embodiments of the present disclosure.

FIG. 13 is a view illustrating a state in which the first cover is conformally engaged with the second cover according to various embodiments of the present disclosure.

Referring to FIG. 13, according to various embodiments, when the first cover 20 and the second cover 30 are conformally engaged with each other, the corner portions of the first cover 20 and the first to fourth seat structures E1 to E4 of the second cover can be maintained in the state where the corner portions of the first cover 20 are in close contact with the first to fourth seat structures E1 to E4 of the second cover, respectively. The first to fourth seat structures E1 to E4 can be conformally engaged with the fourth corners of the first cover 20, respectively, such that the movement of each of the four corner portions of the first cover 20 can be prevented. With this arrangement, a three-dimensional movement can be prevented.

Figure 14:
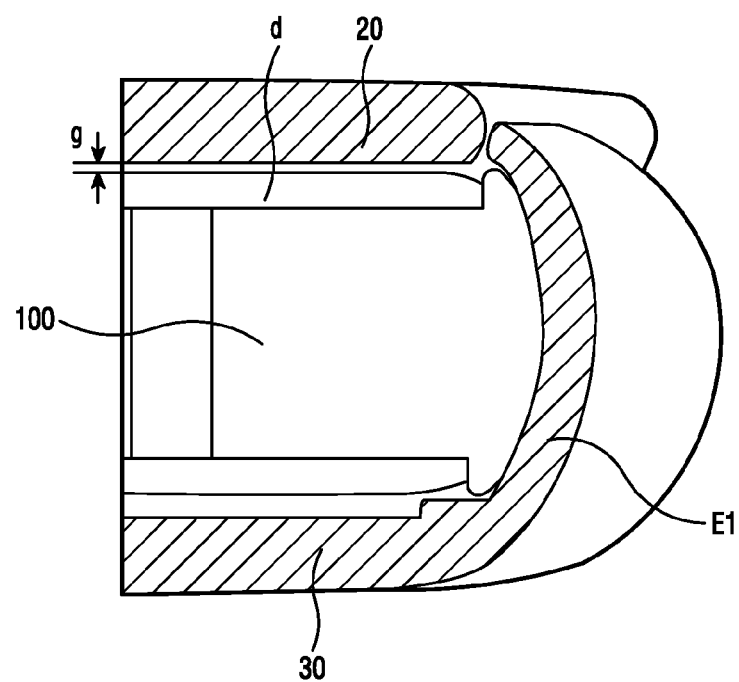
FIG. 14 is a view illustrating a gap between the first cover and the display in the state where the exterior cover according to various embodiments of the present disclosure is conformally engaged.

FIG. 14 is a view illustrating a gap between the first cover and the display in the state where the exterior cover according to various embodiments of the present disclosure is conformally engaged.

Referring to FIG. 14, according to various embodiments, when the electronic device 100 is fitted to the second cover 30 and the first cover 20 is conformally engaged, the first cover 20 can be arranged to form a gap g between the first cover 20 and the front face of the electronic device 100 fitted thereto. That is, the front face of the electronic device, i.e. the display d can be received in a state where it is not in contact with the first cover 20 such that the display can be prevented from being pushed and damaged (e.g., scratched) due to a vertical movement. This can be owed to the conformally engaged structures of the first and second covers 20 and 30 as described above. Due to the conformally engaged structures, the closed state of the first cover 20 can be maintained.

Figures 15A, 15B:
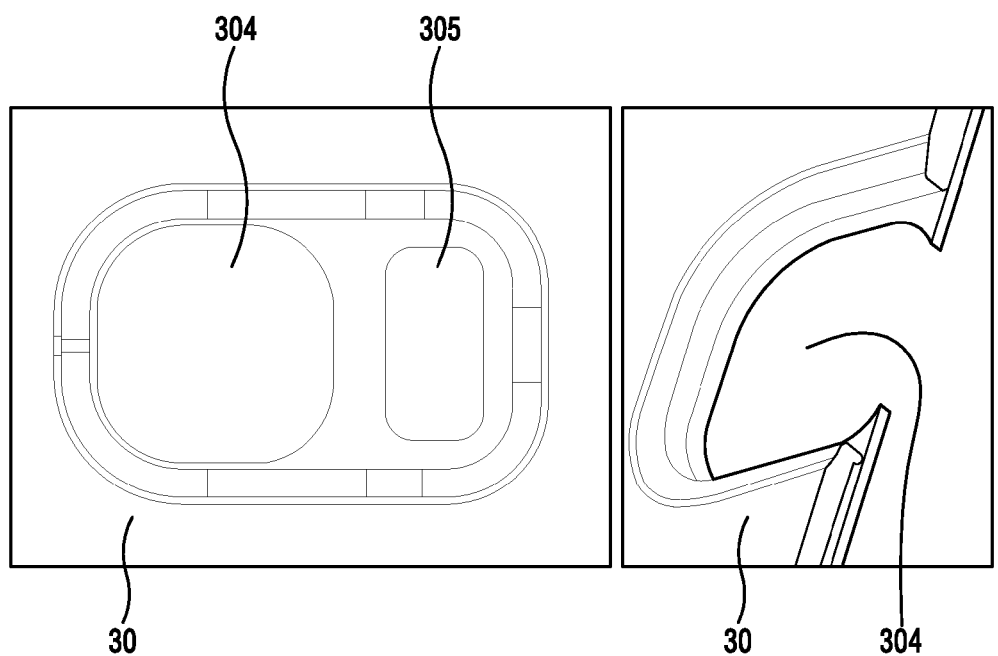
FIGS. 15A and 15B are views illustrating a camera opening or the like that is formed in the second cover according to various embodiments of the present disclosure.

FIGS. 15A and 15B are views illustrating a camera opening or the like that is formed in the second cover according to various embodiments of the present disclosure.

Referring to FIGS. 15A and 15B, according to various embodiments, the second cover can include a camera opening 304 and a flash opening 305. The openings 304 and 305 ensure that a sufficient angle of view of the camera can be secured and interference can be prevented.

Figure 16:
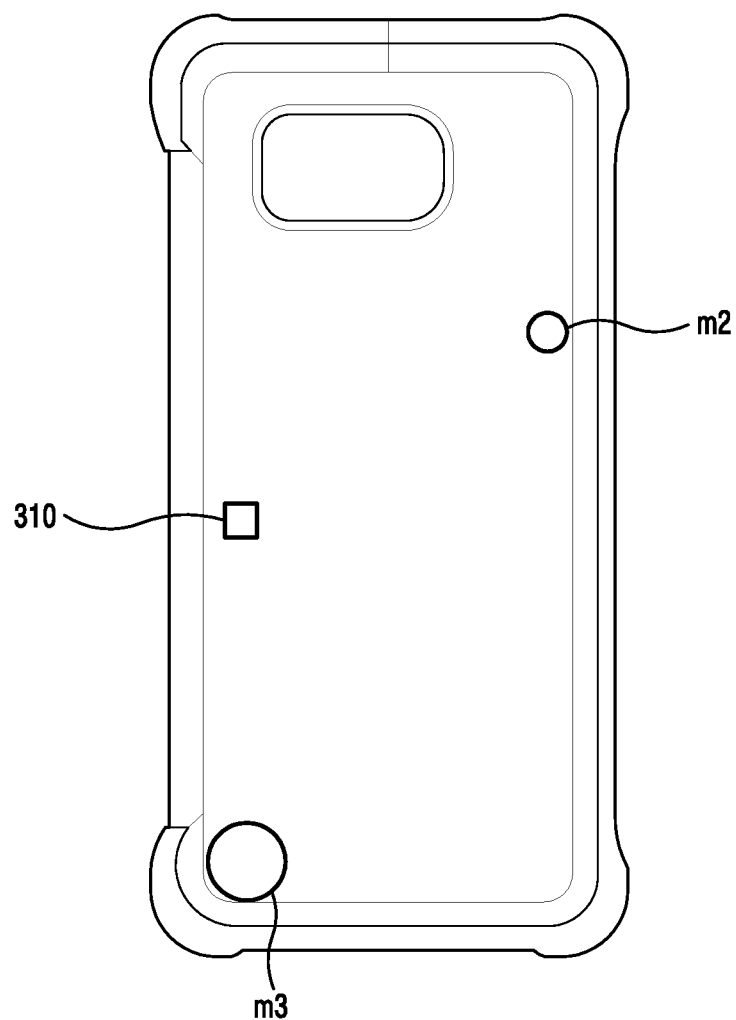
FIG. 16 is a view illustrating an arrangement of components that are mounted on the second cover according to various embodiments of the present disclosure.

FIG. 16 is a view illustrating an arrangement of components that are mounted on the second cover according to various embodiments of the present disclosure.

Referring to FIG. 16, according to various embodiments, when an ID chip 310 is applied to the second cover 30, the second cover 30 can recognize the electronic device and can implement genuine product certification and various UIs depending on a cover color so that imitation can be prevented and can satisfy consumers' desire for diversity. In addition, according to various embodiments, by applying a magnetic material m2 for ID chip recognition to the second cover 30, the ID chip of the cover can recognize the electronic device when the cover is mounted on the electronic device so that the electronic device can be easily operated. When the magnetism of the magnetic material m2 is sensed, an operation can be performed to switch the electronic device to recognize the ID chip.

In addition, according to various embodiments, when a shield sheet m3 can be applied to the second cover 30 to prevent a malfunction of a magnetic force sensing unit (hall IC), the malfunction of the magnetic force sensing unit can be prevented when the first cover 20 is turned inside out and used. In other words, when the first cover is folded to the rear side, in order to prevent the magnetic material, which is provided on the first cover, from being sensed by the hall sensor so as to prevent a malfunction from being caused as if the cover is closed, a sheet can be applied as a shield material.

In addition, according to various embodiments, by applying fabric to the inner surface of the second cover 30, it is possible to enhance an aesthetic effect by concealing various structures (e.g., the chip or the magnetic materials), and it is possible to prevent the electronic device from being stabbed and worn by preventing slippage and impact when the electronic device is seated.

In addition, according to various embodiments, when the first cover and/or the second cover are configured in a foldable structure, the first and second cover can be used as a cradle of an electronic device.

In addition, the shape of the first cover can be changed, or the shape of the second cover can be changed. In addition, the second cover may be made of a translucent synthetic resin, or both the first and second covers may be made of a transparent synthetic resin.

Various embodiments of the present disclosure may apply injection molding of a translucent material in order to maximize design and usability.

In addition, various embodiments of the present disclosure provide conformally engaged structures of corner regions so that the first cover can be supported by the second cover not to come in contact with the display.

In addition, various embodiments of the present disclosure apply a hall IC and an ID chip so that the recognition of an electronic device is enabled so that a UI, which is differentiated from products of other companies, may be provided, which enables the extension of a SW function and may enhance consumers' satisfaction.

Each of the above-described elements of the electronic device according to various exemplary embodiments of the present disclosure may be comprised of one or more components, and the names of the elements may vary according to the kind of the electronic device. The electronic device according to various exemplary embodiments of the present disclosure may include at least one of the above-described elements, and some of the elements may be omitted or an additional element may be further included. In addition, some of the elements of the electronic device according to various exemplary embodiments of the present disclosure may be combined into a single entity, and may perform the same functions as those of the elements before being combined.

It will be appreciated that embodiments of the present disclosure according to the claims and description in the specification can be realized in the form of hardware, software or a combination of hardware and software.

Any such software may be stored in a computer readable storage medium. The computer readable storage medium stores one or more programs (software modules), the one or more programs comprising instructions, which when executed by one or more processors in an electronic device, cause the electronic device to perform a method of the present disclosure.

Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape or the like. It will be appreciated that the storage devices and storage media are embodiments of machine-readable storage that are suitable for storing a program or programs comprising instructions that, when executed, implement embodiments of the present disclosure.

Accordingly, embodiments provide a program comprising code for implementing apparatus or a method as claimed in any one of the claims of this specification and a machine-readable storage storing such a program. Still further, such programs may be conveyed electronically via any medium such as a communication signal carried over a wired or wireless connection and embodiments suitably encompass the same.

disclosure Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An exterior cover for an electronic device, the exterior cover comprising:
   a first cover made of a translucent resin material;
   a second cover; and
   a connecting member interconnecting the first and second covers,
   wherein the second cover includes a magnetic material to be detected by the electronic device and an identification (ID) chip to be scanned by the electronic device in response to the magnetic material being detected.

2. The exterior cover of claim 1, wherein the first cover is a top cover to open or close a display arranged on a front face of the electronic device, and the second cover is a rear face of the electronic device itself or is formed as a cradle that is removable from the rear face of the electronic device.

3. The exterior cover of claim 1, wherein an outer surface of the first cover further includes a deposited layer providing a mirror effect, the deposited layer formed on an entirety of the outer surface or a portion of the outer surface.

4. The exterior cover of claim 3, wherein the deposited layer is colored and provides a glass effect through tin and multi-deposition.

5. The exterior cover of claim 1, wherein an inner surface of the first cover further includes an anti-scratch and anti-pollution layer formed on an entirety of the inner surface or a portion of the inner surface.

6. The exterior cover of claim 1, wherein the first cover further includes a receiver opening.

7. The exterior cover of claim 1, wherein the first cover further includes a recess on an inner surface thereof to receive at least a portion of a home key when the first cover is closed to the electronic device.

8. The exterior cover of claim 1, wherein the first cover has corners and the second cover includes seat structures, and the corners are conformally engaged with the seat structures, respectively.

9. The exterior cover of claim 1, wherein the magnetic material is recognized by a magnetic power sensing unit of the electronic device.

10. The exterior cover of claim 1, wherein the connecting member includes an inner skin and an outer skin that is bonded to at least a portion of the inner skin by pressure, and
    wherein the connecting member further includes stepped coupling structures that are coupled to the first and second covers, respectively, so that the inner skin or the outer skin is suppressed from being pushed.

11. An exterior cover for an electronic device, the exterior cover comprising:
    a cradle cover to which the electronic device is fitted;
    a top cover that opens or closes a front face of the electronic device; and
    a connecting member interconnecting the top cover and the cradle cover,
    wherein the top cover is configured to be conformally engaged with the cradle cover,
    wherein the cradle cover includes a magnetic material to be detected by the electronic device and an identification (ID) chip to be scanned by the electronic device in response to the magnetic material being detected.

12. The exterior cover of claim 11, wherein, when the top cover is conformally engaged with the cradle cover, the top cover is not in contact with the front face of the electronic device.

13. The exterior cover of claim 12, wherein the cradle cover include seat structures that are provided at four corner regions, respectively, and the seat structures are configured to conformally engaged with four corners of the top cover, respectively.

14. The exterior cover of claim 13, wherein each of the seat structures has a hook shape, and an end of each of the seat structures elastically maintains one of the corners of the top cover.

15. The exterior cover of claim 13, wherein an outer surface of the top cover further includes a deposited layer providing a mirror effect, the deposited layer formed on an entirety of the outer surface or a portion of the outer surface.

16. The exterior cover of claim 13, wherein an inner surface of the top cover further includes an anti-scratch and anti-pollution layer formed on an entirety of the inner surface or a portion of the inner surface.

17. The exterior cover of claim 13, wherein the top cover further includes a receiver opening.

18. The exterior cover of claim 13, wherein the top cover further includes a recess on an inner surface thereof to receive at least a portion of a home key when the top cover is closed to the electronic device.

19. The exterior cover of claim 13, wherein the top cover has corners and the cradle cover includes seat structures, and the corners are conformally engaged with the seat structures, respectively.

20. The exterior cover of claim 13, wherein the connecting member includes an inner skin and an outer skin that is bonded to at least a portion of the inner skin by pressure, and
   wherein the connecting member further includes stepped coupling structures that are coupled to the top and cradle covers, respectively, so that the inner skin or the outer skin is suppressed from being pushed.

* * * * *